United States Patent [19]

Takeda

[11] Patent Number: 5,304,928
[45] Date of Patent: Apr. 19, 1994

[54] METHOD OF MAGNETIC RESONANCE IMAGING

[75] Inventor: Ryuzaburo Takeda, Mito, Japan

[73] Assignee: Hitachi, Ltd., Tokyo, Japan

[21] Appl. No.: 854,013

[22] Filed: Mar. 19, 1992

[30] Foreign Application Priority Data

Mar. 20, 1991 [JP] Japan .................................. 3-056965

[51] Int. Cl.$^5$ .......................................... G01R 33/20
[52] U.S. Cl. .................................................. 324/309
[58] Field of Search ............... 324/300, 307, 309, 310, 324/311, 312, 313, 314, 318, 322; 128/653.2, 653.5

[56] References Cited

U.S. PATENT DOCUMENTS

| 4,620,153 | 10/1986 | Hino ..................... | 324/309 |
| 4,665,364 | 5/1987 | Hanawa .................. | 324/309 |
| 4,789,833 | 12/1988 | Nishimura ............... | 324/320 |
| 4,827,235 | 5/1989 | Inomata et al. .......... | 335/297 |
| 4,868,502 | 9/1989 | Hanakawa et al. ........ | 324/309 |
| 5,101,157 | 3/1992 | Nagashima et al. ........ | 324/309 |
| 5,109,854 | 5/1992 | Provost ................. | 324/309 |

OTHER PUBLICATIONS

Society of Magnetic Resonance In Medicine, 1988, vol. 1, "Phase Offset Multi-Planar Imaging".

Primary Examiner—Michael J. Tokar
Attorney, Agent, or Firm—Fay, Sharpe, Beall, Fagan, Minnich & McKee

[57] ABSTRACT

A novel method of magnetic resonance imaging is disclosed, in which a single high-frequency magnetic field signal synthesized from a plurality of high-frequency components associated with a plurality of slice sections respectively is applied to a subject to excite the slice sections at the same time, and a phase encode pulse is applied in the direction perpendicular to a slice section. Information corresponding to the position of a slice section is applied to the phase of an excited spin and a measurement signal is subjected to Fourier transformation thereby to produce a data corresponding to each slice section. The phases of a plurality of high-frequency components of a high-frequency magnetic field signal are controlled to be in a predetermined relationship to each other at a predetermined timing.

6 Claims, 10 Drawing Sheets

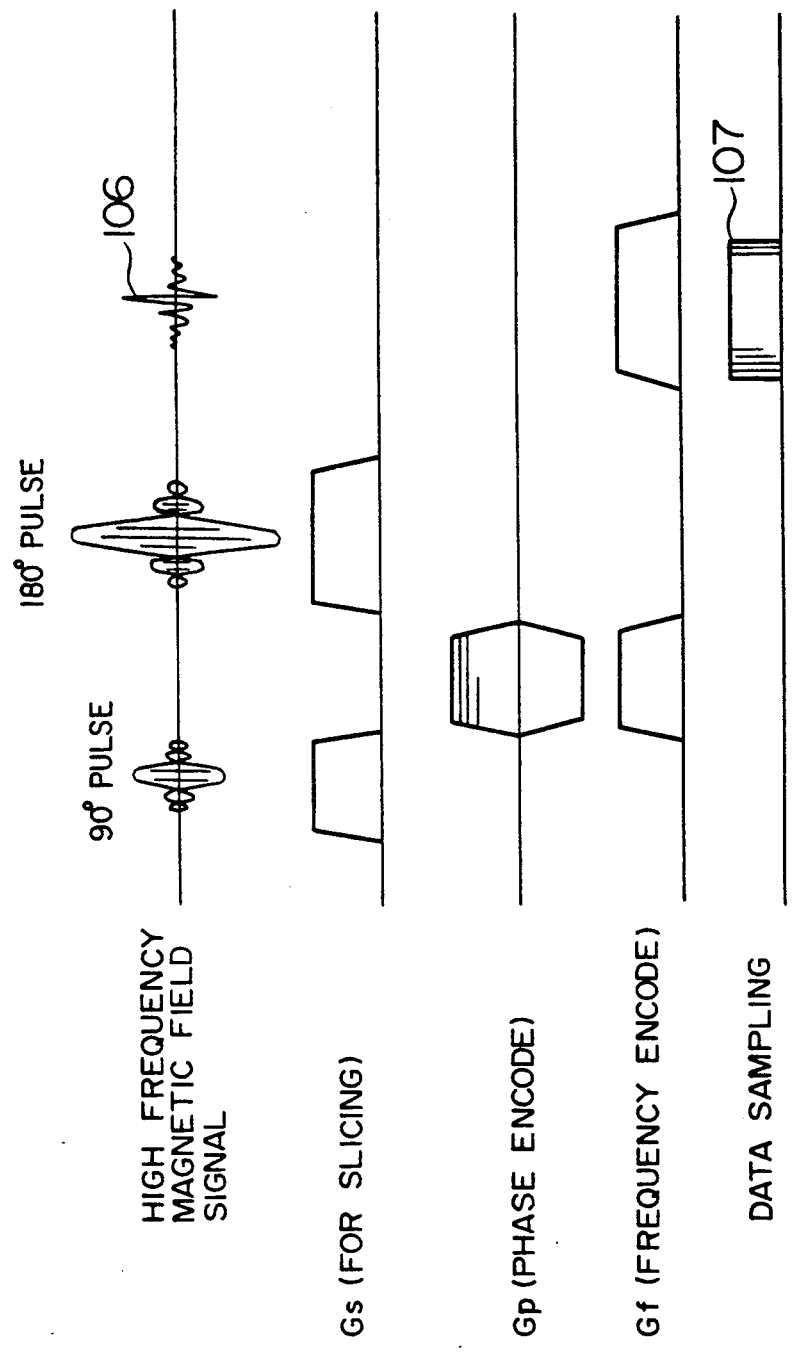
FIG. 3 [PRIOR ART]

FIG. 4A
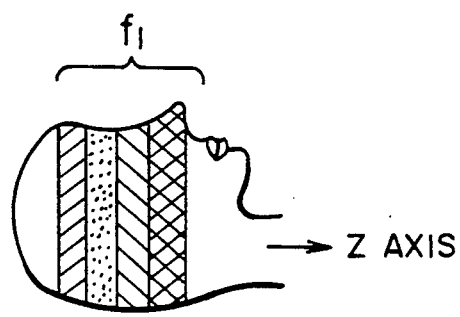
FIG. 5 [PRIOR ART]
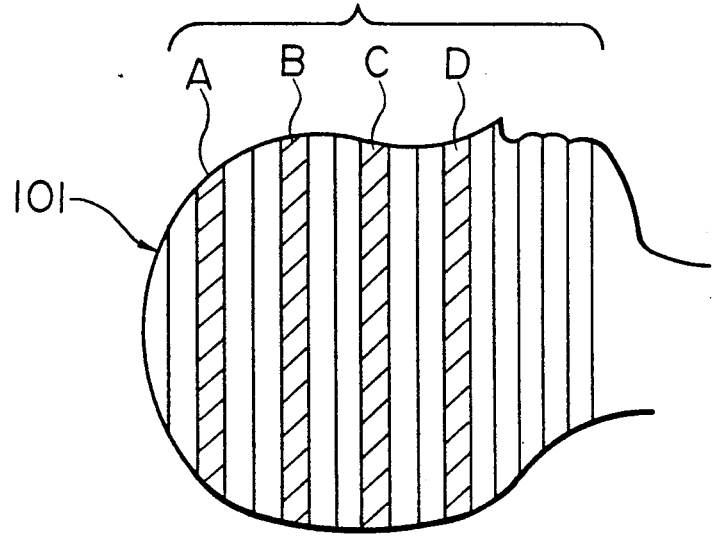

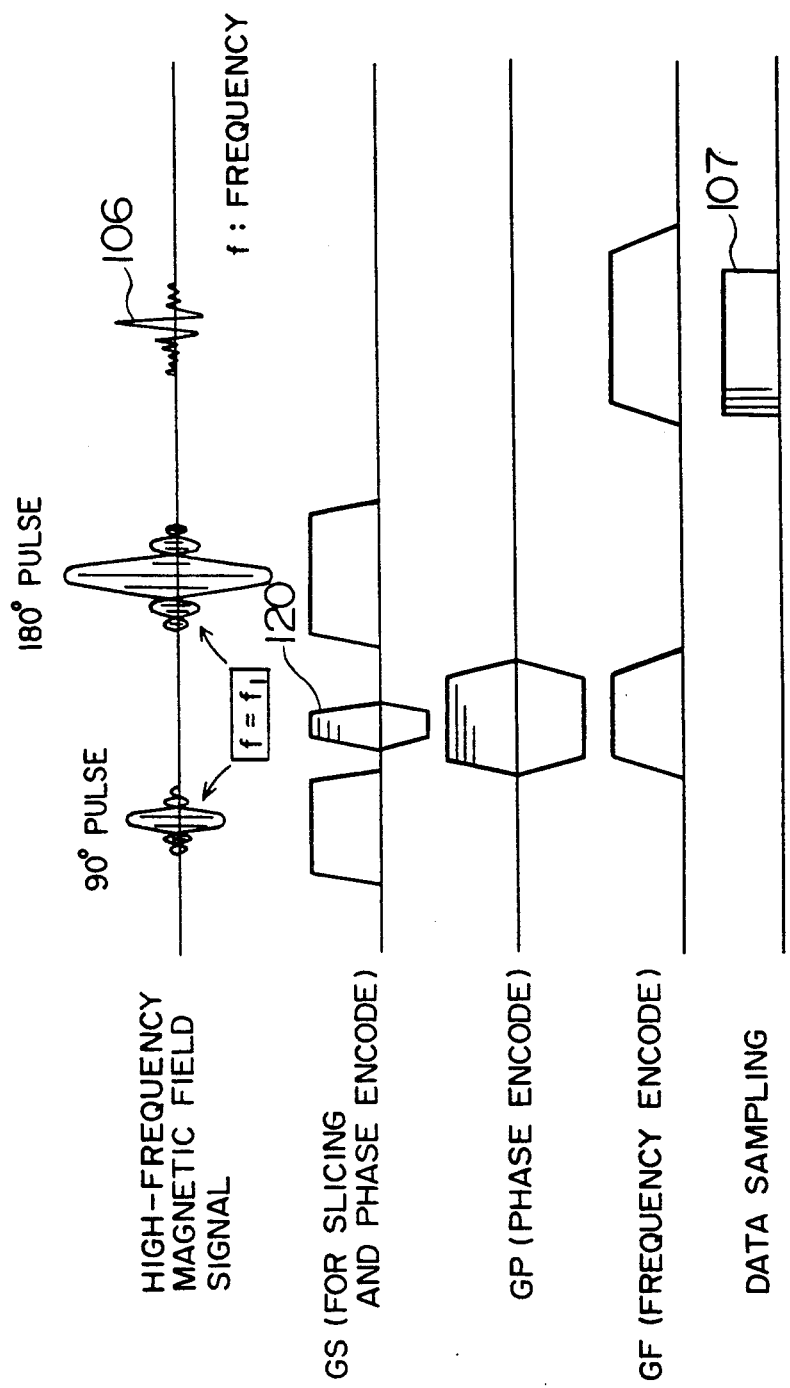

FIG. 6 [PRIOR ART]

HIGH-FREQUENCY MAGNETIC FIELD $= A_1 \sin(2\pi f_1 + \theta_1)$
$+ A_2 \sin(2\pi f_2 + \theta_2)$
$+ A_3 \sin(2\pi f_3 + \theta_3)$
$+ A_4 \sin(2\pi f_4 + \theta_4)$

| SLICE NO. | RESONANCE FREQUENCY AT SLICE PLANE | PHASE CONTROL FOR EACH APPLICATION OF HIGH-FREQUENCY MAGNETIC FIELD | | | |
|---|---|---|---|---|---|
| | | 1st | 2nd | 3rd | 4th |
| 1 | $f_1$ | $\theta_1 = 180°$ | 90° | 0° | -90° |
| 2 | $f_2$ | $\theta_2 = 90°$ | 45° | 0° | -45° |
| 3 | $f_3$ | $\theta_3 = 0°$ | 0° | 0° | 0° |
| 4 | $f_4$ | $\theta_4 = -90°$ | -45° | 0° | 45° |

FIG. 10

HIGH-FREQUENCY MAGNETIC FIELD $= A_1 \sin(2\pi f_1 + \theta_1)$
$+ A_2 \sin(2\pi f_2 + \theta_2)$
$+ A_3 \sin(2\pi f_3 + \theta_3)$
$+ A_4 \sin(2\pi f_4 + \theta_4)$

| SLICE NO. | RESONANCE FREQUENCY AT SLICE PLANE | PHASE CONTROL FOR EACH APPLICATION OF HIGH-FREQUENCY MAGNETIC FIELD | | | |
|---|---|---|---|---|---|
| | | 1st | 2nd | 3rd | 4th |
| 1 | $f_1$ | $\theta_1 = K_1$ | $K_1$ | $K_1$ | $K_1$ |
| 2 | $f_2$ | $\theta_2 = K_2$ | $K_2$ | $K_2$ | $K_2$ |
| 3 | $f_3$ | $\theta_3 = K_3$ | $K_3$ | $K_3$ | $K_3$ |
| 4 | $f_4$ | $\theta_4 = K_4$ | $K_4$ | $K_4$ | $K_4$ |

METHOD OF MAGNETIC RESONANCE IMAGING

BACKGROUND OF THE INVENTION

The present invention relates to a method of magnetic resonance imaging, or more in particular to a method of magnetic resonance imaging which makes it possible to prepare tomographic images of a plurality of faults in a subject at a time.

The operating principle of a magnetic resonance imaging apparatus will be generally explained. The magnetic resonance imaging apparatus is for exciting the phenomenon of magnetic resonance in a specific fault selected in a subject or specimen and imaging the resulting resonance signal as a fault plane information. The condition for generating a magnetic resonance is given as $$f = \gamma \cdot H \tag{1}$$

where f is the frequency of a high-frequency magnetic field applied for exciting a magnetic resonance, $\gamma$ the gyromagnetic ratio (a constant determined by nuclear species) and H the intensity of the magnetic field.

In order to excite the phenomenon of magnetic resonance in a subject, a high-frequency magnetic field having a frequency meeting the above-mentioned condition is applied. Conversely, as far as the above-mentioned condition fails to be met, no magnetic resonance is attained even when a high-frequency magnetic field is applied.

An imaging technique is well-known and mainly utilizes the two-dimensional Fourier method.

If an imaging is to be conducted successfully, it is necessary to generate a magnetic resonance in the spin of the fault intended for imaging. Generation of a magnetic resonance in the fault is called "slicing".

The principle of slicing will be explained with reference to FIG. 1. In FIG. 1, an example for slicing along a cross section of the head of human being, i.e., a plane crossing at right angle to the axon (Z axis) is illustrated. According to a method of magnetic resonance imaging, the subject is placed in a static magnetic field of uniform intensity, and a magnetic field different in intensity with the position along the axon crossing at right angle to the fault plane intended for slicing is superimposed on the uniform static magnetic field. The magnetic field to be superimposed on is generally the one of which the intensity of the magnetic field changes linearly with the positional coordinate. A magnetic field such as this is called "an inclined magnetic field". In FIG. 1, reference numeral 101 designates a head, and numeral 102 a fault to be imaged. The graph 3 plotted under the head shows a change characteristic of an inclined magnetic field. In the coordinate of the graph, the abscissa represents the position along the direction of axon (Z axis), and the ordinate the intensity of the magnetic field. A position in the head 101 corresponds to the one along the abscissa of the graph 103. In FIG. 1, the intensity of the magnetic field corresponding to the central position 102a of the fault 102 is expressed as H'. Substituting this intensity of magnetic field H' into the equation (1) representing the resonance condition, $$f' = \gamma \cdot H'$$

This shows that the frequency of a high-frequency magnetic field required for generating a magnetic resonance in the fault 102 is give as f'. Actually, however, the fault 102 has a predetermined thickness as shown and the value f' has an expansion corresponding to the thickness. Therefore, the frequency component of the high-frequency magnetic field is required to have a uniform intensity within the bandwidth of $$f' - \Delta f \sim f' + \Delta f$$

In order to apply a high-frequency magnetic field as described above to the subject, the subject is impressed with a high-frequency magnetic field obtained by subjecting a carrier wave 105 of frequency f' to amplitude modulation in a waveform based on a sinc function 104 as shown in FIG. 2.

Completion of slicing also ends the application of an inclined magnetic field. At the end of slicing, therefore, the subject is placed again in a uniform static magnetic field. As a result, the resonance frequency in the subject changes from f' to $f_0$. This value $f_0$ represents a resonance frequency corresponding to the intensity of a uniform static magnetic field $H_0$.

In other words, all the spins excited tend to return to the original state while rotating at the resonance frequency $f_0$.

Then, in order to identify each resonance signal from the fault 102 in accordance with the position thereof, two coordinate axes intersecting each other at the end of the fault are set, and a signal is taken in with the frequency and phase of the resonance signal set in correspondence with each other along the direction of each coordinate axis. The signal thus taken in is subjected to Fourier transformation, separated by spatial position and is arranged on a screen corresponding to each position thereby to obtain a fault image. Setting a positional coordinate in correspondence with the phase and frequency of a resonance signal is called "the phase encoding" and "the frequency encoding" respectively.

The above-mentioned imaging technique is called the two-dimensional Fourier transformation imaging. A general timing chart for this technique is shown in FIG. 3. In FIG. 3, the abscissa represents a time axis, Gs an inclined magnetic field for slicing used to select a fault wherefrom a resonance signal is to be taken out, Gp an inclined magnetic field for phase encoding which is maintained at a predetermined magnitude during a series of operations for taking in a resonance signal, and Gf an inclined magnetic field for frequency encoding applied when taking in a resonance signal. The ordinate of each graph represents the magnitude of inclination. The inclined magnetic field Gp for phase encoding is changed in magnitude by a predetermined value for each series of operation. The resonance signal 106 taken in is subjected to homodyne detection by a reference signal having a reference frequency so that the resonance signal is changed to a signal having a frequency equivalent to the difference with the reference frequency. Further, the signal data 107 thus obtained is subjected to two-dimensional Fourier transformation thereby to prepare a fault image.

Another method of producing a fault image is called the three-dimensional Fourier transformation imaging. According to this method, a plurality of successive faults at predetermined intervals along the direction of slicing (direction of axon) are excited by a high-frequency magnetic field of the same frequency at a time as shown in FIG. 4A. A related pulse sequence is shown in FIG. 4B.

In order to discriminate a plurality of slice sections from each other, a phase encoding pulse is applied also along the direction of slicing thereby to differentiate the rotational phase of spin for each slice section. The three-dimensional imaging, though superior in photographing successive adjacent faults, requires a measurement time and data processing more than necessary when it is desired to obtain only images of a plurality of faults distant from each other in a three-dimensional photographic block, thereby leading to the disadvantage of considerable waste. This problem is illustrated in FIG. 5. In FIG. 5, in the case where it is desired to obtain fault images of four faults A to D distant from each other, a slicing operation is required as specified by the minimum slice width and position. It is, therefore, necessary to produce images of the four faults and also the remaining two successive faults adjacent to the respective faults. This poses the problem of necessity for taking measurements four times as much as is originally necessary for the faults A to D.

A technical reference on the prior art related to the present invention includes "POMP (Phase Offset Multi-Planar)", by G. H. Glover and A. Shimakawa General Electric Medical Systems, Collection of Texts Vol. 1, 1988, for The Seventh Annual Conference of Society of Magnetic Resonance in Medicine. According to the cited reference, in preparing a plurality of fault images, a high-frequency magnetic field irradiated on a subject for selecting a fault is synthesized by a plurality of high-frequency magnetic fields different in frequency corresponding to each slice section. When the high-frequency magnetic field is removed, the spins of the excited slice sections are rotated with the same frequency. In order to obtain information along the direction of axon in each slice section, the conventional method described in the cited reference discloses a technique in which the phases of the synthesized high-frequency magnetic field are displaced by a predetermined interval without applying a phase encode pulse along the direction of slicing, so that the rotational phase of the spin of each slice section is differentiated simultaneously with the excitement of the slice section thereby to select a plurality of faults. This technique requires a technologically complicated, sophisticated phase control.

An example of a high-frequency magnetic field synthesized as above is shown in FIG. 6. As seen from FIG. 6, the phases $\theta_1$ to $\theta_4$ are required to be changed by a predetermined amount each time a high-frequency magnetic field is applied.

The difference in phase change is detected as a frequency difference by Fourier transformation thereby to produce a signal associated with each slice section.

SUMMARY OF THE INVENTION

The object of the present invention is to provide an efficient method of magnetic resonance imaging for exciting a plurality of faults distant from each other, in which only a plurality of required faults are excited by utilizing a conventional method of three-dimensional imaging.

According to one aspect of the present invention, there is provided a method of magnetic resonance imaging wherein in order to excite a plurality of faults positioned distant from each other, a high-frequency magnetic field to be applied contains a plurality of frequency components corresponding to the faults respectively, and the mutual phase relationship between the frequency components is controlled before irradiation in such a manner as to maintain a fixed relation at a predetermined timing.

According to another aspect of the present invention, there is provided a method of magnetic resonance imaging, wherein in order to produce images of a plurality of faults, a two-dimensional imaging sequence is repeatedly executed by a number equal to the number of faults, and at the same time, in order to separate the data superimposed along the direction perpendicular to the fault section, an inclined magnetic field for phase encoding is applied along the direction of slicing. The resulting measurement signal is subjected to the two-dimensional Fourier transformation in the directions parallel to the fault sections and Fourier transformation along the direction perpendicular to each fault section. In the process, the faults are imaged thereby to produce a plurality of fault images at a time.

According to the present invention, it is not necessary to change the phase of each high-frequency magnetic field component each time of application of a high-frequency magnetic field, but the phase relationship is controlled at a fixed level at a predetermined timing, thus eliminating the need of a complicated phase control.

As is clear from the above description, according to the present invention, in conducting the magnetic resonance imaging by selecting a plurality of faults existing distantly from each other, only the faults required of imaging are excited at the same time, and the resulting resonance signals are applied as an input, while at the same time processing data to produce an image of each fault section. The disadvantages of the three-dimensional imaging are thus improved and an efficient signal collection is made possible within a short time for an improved photographic sensitivity.

BRIEF DESCRIPTION OF THE DRAWINGS

FIG. 3 is a sequence chart showing the timing of operation according a conventional method of two-dimensional Fourier transformation imaging.

FIG. 4A is a diagram showing successive fault sections.

FIG. 4B is a sequence chart showing the timing of operation according to a conventional three-dimensional Fourier transformation imaging.

FIG. 5 is a diagram for explaining the manner in which a plurality of faults are selected in a subject according to a conventional method of three-dimensional imaging.

FIG. 6 is a diagram showing an example of conventional phase control of a high-frequency magnetic field.

FIG. 10 is a diagram showing an example of phase control of a high-frequency magnetic field according to the present invention.

DESCRIPTION OF THE PREFERRED EMBODIMENTS

Figure 7:
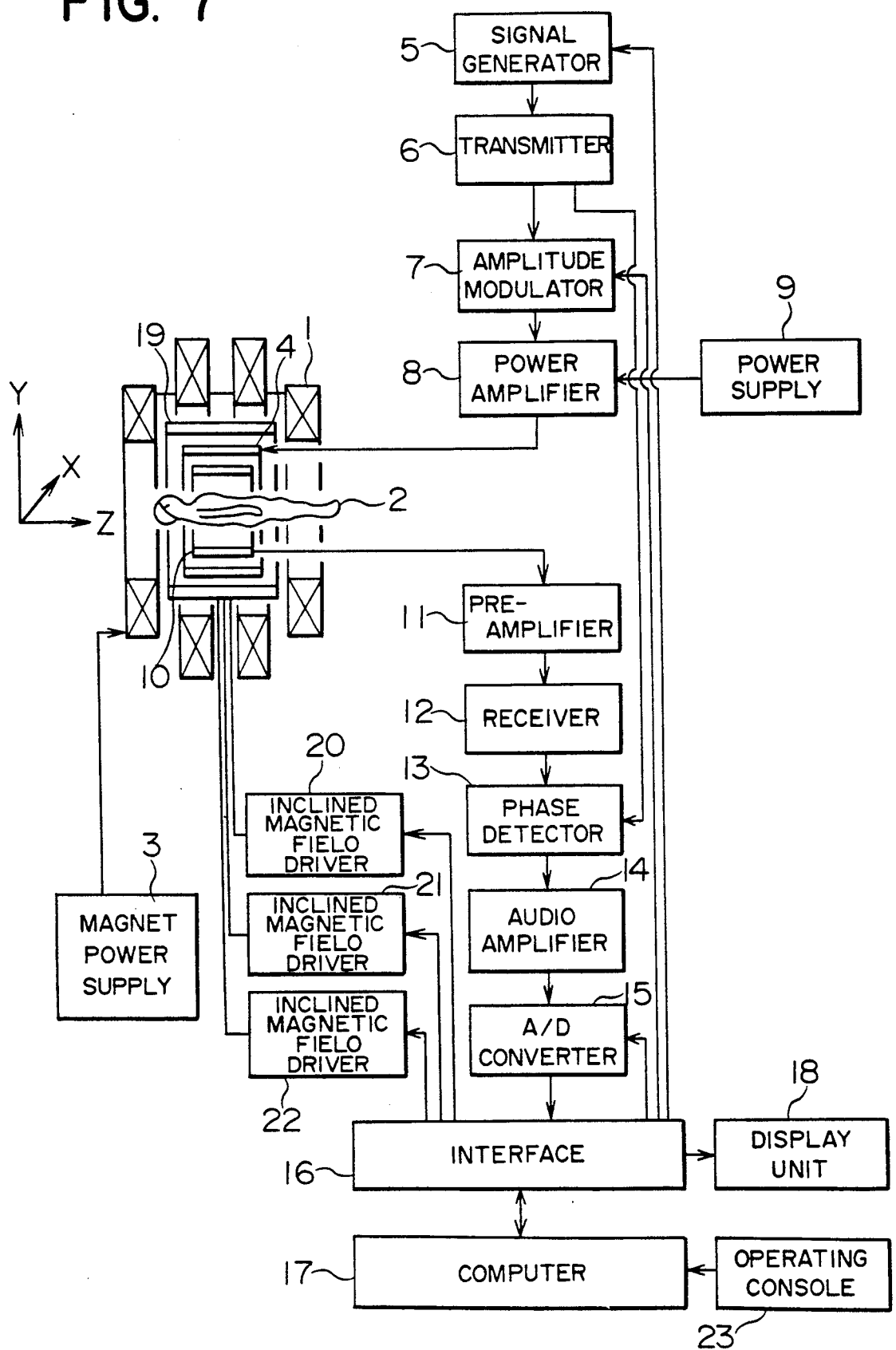
FIG. 7 is a block diagram showing a system configuration of an MRI system for executing a method of magnetic resonance imaging according to the present invention.

FIG. 7 is a diagram schematically showing a system configuration of a magnetic resonance imaging apparatus (hereinafter referred to as "the MRI apparatus") for implementing a method of magnetic resonance imaging according to the present invention. This MRI apparatus is used for medical purposes. In FIG. 7, numeral 1 designates a magnet making up the essential part of the MRI apparatus. Numeral 2 designates a subject lying on a patient table (not shown) arranged along the center axis of the internal space of the magnet 1. The magnet 1 is supplied with a required current from a magnet source 3 and is excited to generate a static magnetic field having a uniform intensity in the internal space thereof.

On the other hand, a high-frequency magnetic field is required for causing a phenomenon of magnetic resonance within the internal structure of the subject 2. This high-frequency magnetic field is applied from an irradiation coil 4 to the subject 2. The high-frequency magnetic field is produced at a signal generator 5 on the basis of a high-frequency signal having a predetermined frequency. The signal generator 5 includes an ROM and an address counter. A waveform of a high-frequency signal with addresses set correspondingly along time axis is stored in the ROM. The high-frequency signal outputted from the signal generator 5 is amplified at a transmitter 6, modified at a power amplifier 8 to the required power, and supplied to the irradiation coil 4. The frequency of the high-frequency magnetic field issued from the irradiation coil 4 is the same as that of the high-frequency signal. By controlling the frequency of the high-frequency signal outputted from the signal generator 5, therefore, it is possible to generate a high-frequency magnetic field of a desired frequency. The power amplifier 8 is connected to and supplied with power from a power supply 9. As a result of impression of a high-frequency magnetic field, the magnetic resonance signal generated in the subject 2 is detected by a receiving coil 10. The magnetic resonance signal thus detected is amplified and taken out at a preamplifier 11 and a receiver 12 respectively. Further, this signal is subjected to homodyne detection at a phase detector 13 on the basis of a reference signal supplied from the transmitter 6. The magnetic resonance signal thus subjected to homodyne detection is an electrical signal having a frequency equal to the frequency difference between the original magnetic resonance signal and the reference signal. This signal has an audible frequency, which is amplified at an audio amplifier 14 with a low-pass filter, converted into a digital signal at an A/D converter 15 and supplied to a computer 17 as a measurement data through an interface 16. The measurement data thus taken into the computer 17 is subjected to Fourier transformation and other processes for image reconstruction, and the result of processing is outputted through the interface 16 to a display unit 18.

In order to generate the phenomenon of magnetic resonance described above at a specified fault selected in the subject 2, it is necessary to apply an inclined magnetic field by an inclined magnetic field coil 19 as well as a static magnetic field. The inclined magnetic field coil 19 includes three component coils for generating an inclined magnetic field with the magnetic intensity changing according to the inclination characteristics along each of three axes crossing at right angles to each other. Due to these three component coils, the inclined magnetic field coil 19 generates an inclined magnetic field along the axon (Z axis), the vertical direction (Y axis) and the lateral direction (as viewed from above)(X axis) of the subject 2. The component coils of the inclined magnetic field coil 19 are connected with inclined magnetic field drivers 20 to 22 independently of each other respectively. The inclined magnetic field drivers 20 to 22 are in turn connected to the computer 17 through the interface 16. The component coils of the inclined magnetic field coil 19 are controlled by the computer 17 in accordance with an appropriate time chart. The entire system is controlled by the operator working on an operating console 23.

Now, a method of controlling the operation of the MRI apparatus for embodying a method of magnetic resonance imaging according to the present invention will be explained with reference to FIG. 8.

Figure 8:
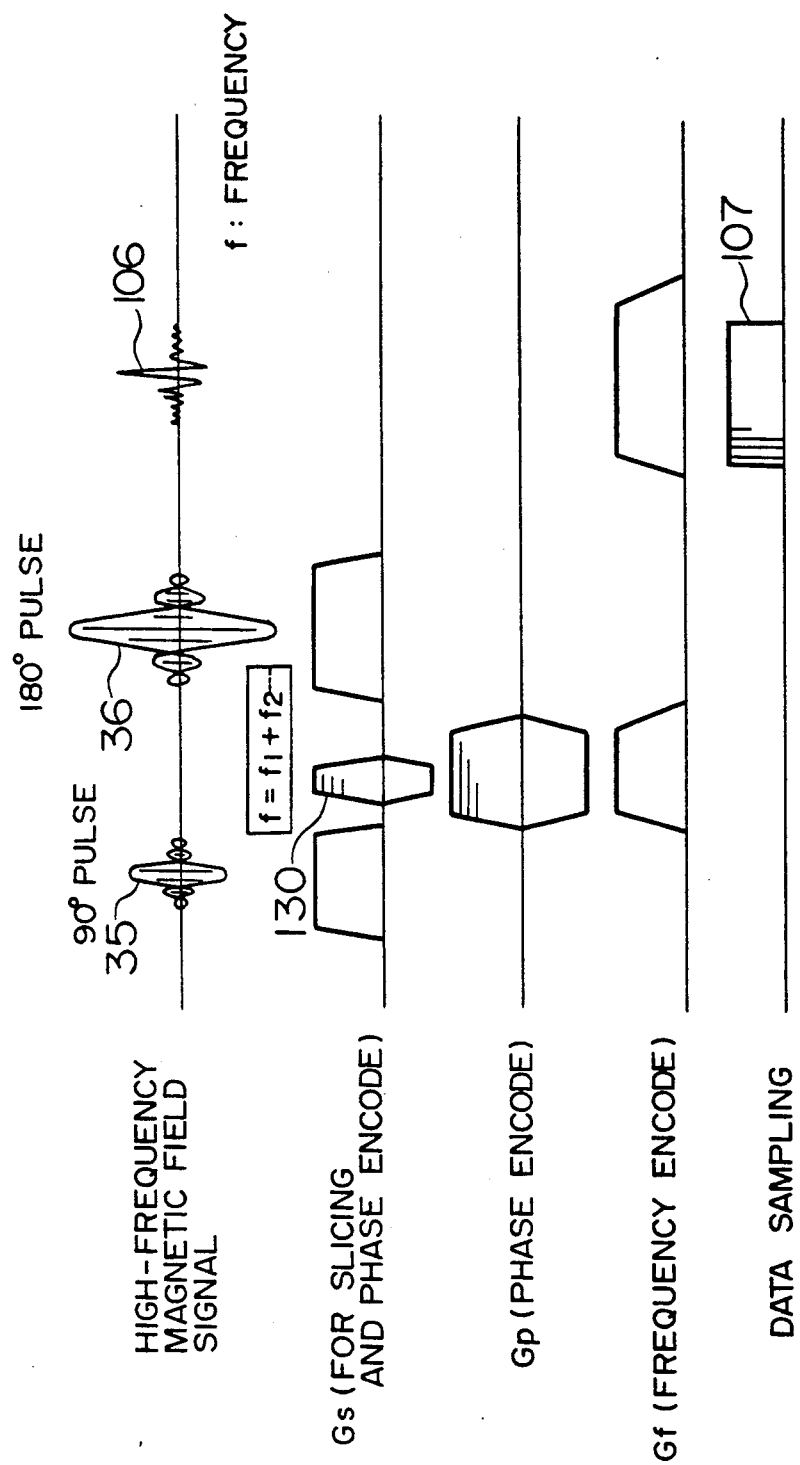
FIG. 8 is a sequence chart showing the timing of operation by a method of magnetic resonance imaging according to the present invention.

FIG. 8 is a chart showing the sequence for forming a fault image. In a method of magnetic resonance imaging according to the present invention, in order to prepare images of a plurality of faults at the same time in the subject 1, the magnetic resonance is caused in the faults selectively and a magnetic resonance signal of each fault is produced and subjected to an imaging process.

Figure 9:
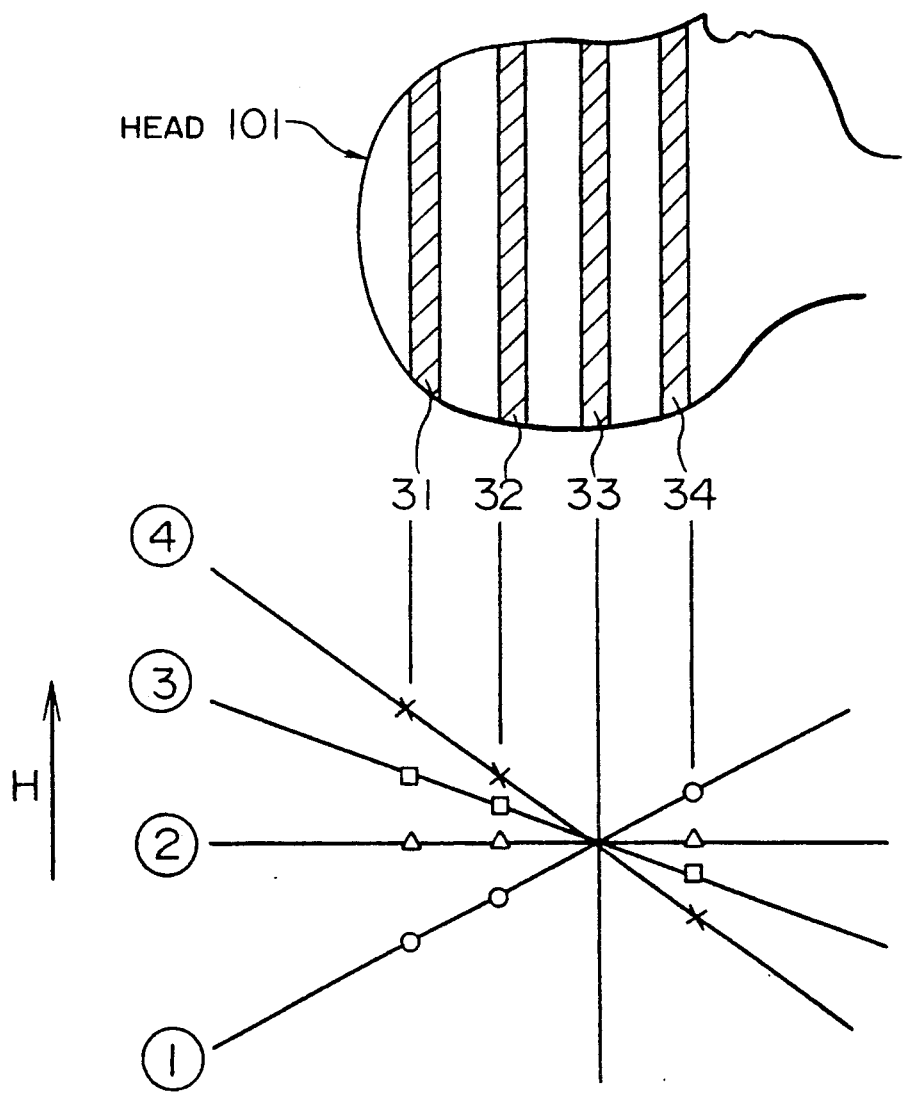
FIG. 9 is a diagram showing a phase change and phase encode pulse along the direction of slicing.

FIG. 9A is a longitudinal sectional view showing an example of a plurality of faults for which images are to be produced. In FIG. 9A, numerals 31, 32, 33 and 34 designate selected faults in the head of the subject 2. In the illustrated example, images of the four faults are prepared at the same time.

As described above, in the case where a magnetic resonance signal is to be obtained at the same time from a plurality of faults, these faults are required to be excited simultaneously. The high-frequency magnetic field signals 35 and 36 (FIG. 8) for causing a phenomenon of magnetic resonance in the subject 2 and therefore are synthesized ones containing frequency components associated with the respective faults used for exciting the particular faults. The frequency of each frequency component is determined in the manner mentioned below.

Figure 1:
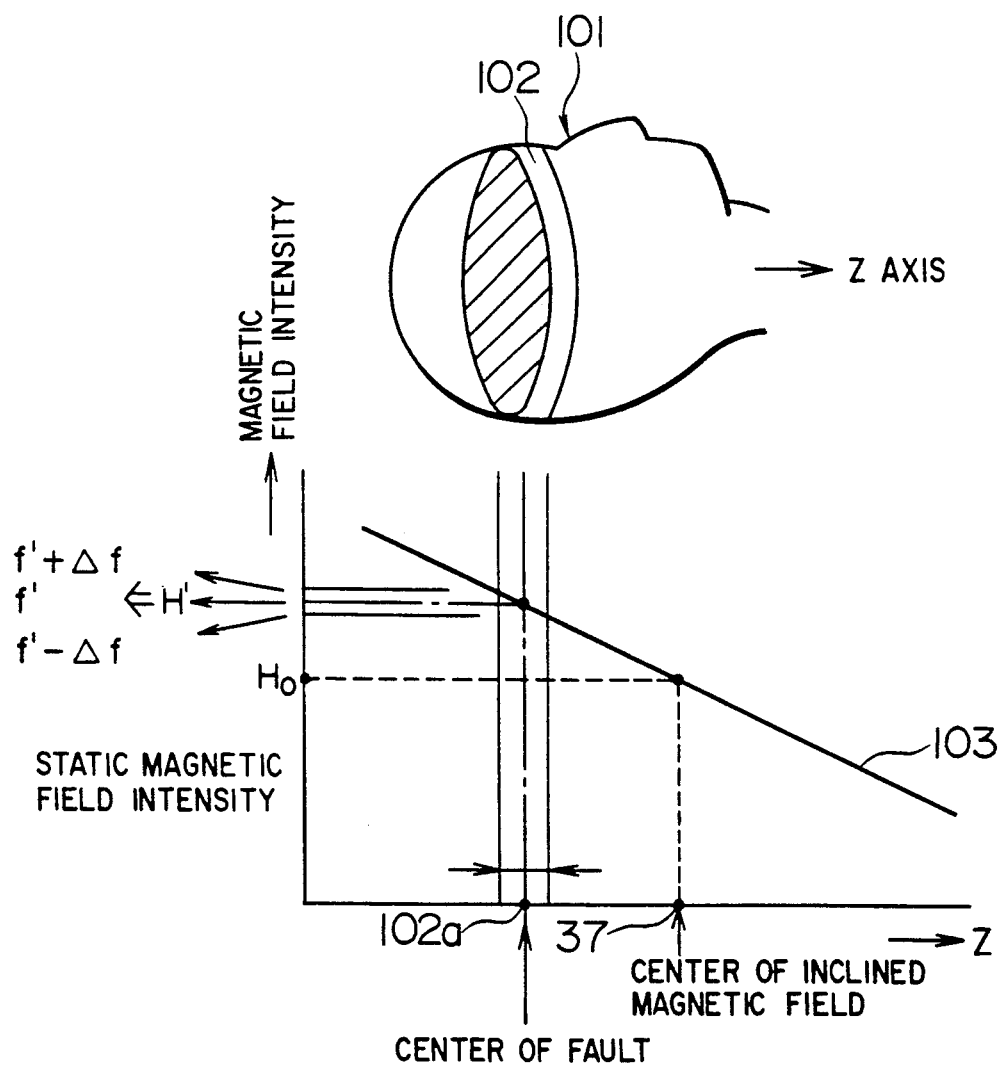
FIG. 1 is a diagram for explaining the positional relationship between a selected fault, an inclined magnetic field and a static magnetic field.
Figure 2:
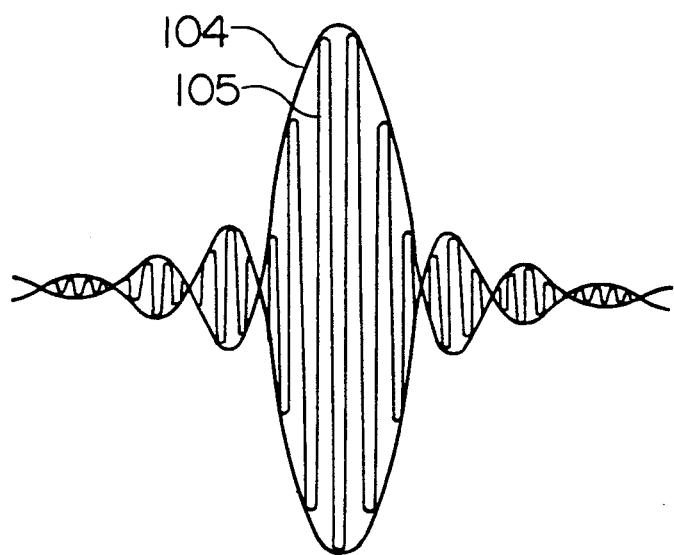
FIG. 2 is a diagram showing a waveform of a high-frequency magnetic field.

First, "the center of an inclined magnetic field" is defined as a position designated by reference numeral 37 in FIG. 1 which has a magnetic field intensity equal to a static magnetic field intensity $H_0$ which remains unchanged even under the influence of an inclined magnetic field. Let $H_0$ be the intensity of a static magnetic field and $f_0$ a corresponding resonance frequency. The relationship between them is expressed by the equation shown below.

$$f_0 = \gamma \cdot H_0 \qquad (2)$$

The magnetic field intensity $H''$ at a position where a fault section is set, on the other hand, is given by $$H' = H_0 + \Delta Z \, G_z \qquad (3)$$

where $\Delta Z$ is the distance from the center of an inclined magnetic field to the position where a fault section is set, and $G_z$ the intensity of an inclined magnetic field for slicing. The intensity $G_z$ of an inclined magnetic field is a function of the position.

As a result, if a plurality of faults are to be excited by magnetic resonance as described above, the frequency components $f_1, f_2 \ldots$ associated with the positions of respective faults are determined from equations (2) and (3). A plurality of high-frequency components thus determined are synthesized and applied on the subject 4 as high-frequency magnetic field pulses 35, 36 at an appropriate timing from the irradiation coil 4. In the process, it is necessary that the phases of the frequency components be maintained constant with a specified timing. The specified timing may be either the time of irradiation or a given time point after the lapse of a predetermined length of time following irradiation. More specifically, a plurality of frequency components are required to be in a constant phase relationship at the time of irradiating the high-frequency magnetic field pulses (90° pulses) shown in FIG. 8, for example. For this purpose, the computer 17 sends a phase reset signal to the address counter of the signal generator to appropriately arrange the phases of corresponding signals for all of the frequency components in the beginning of 90° pulse irradiation.

FIG. 10 shows an example of phase control of a high-frequency magnetic field according to the present invention. It is necessary that the phase remains unchanged each time of application of a high-frequency magnetic field. In FIG. 10, the phases of the four high-frequency magnetic field components are controlled in such a manner as to be $K_1$, $K_2$, $K_3$ and $K_4$ respectively at the time of application. All the phases may of course have the same value such as $K_1=K_2=K_3=K_4=0$.

With the ceasing of application of a high-frequency magnetic field, each spin excited rotates at the same high speed. In order to separate the slice sections, therefore, the positional information along slicing is required to be applied to each spin. For this purpose, a phase encode pulse 130 along the direction of slicing used in the conventional three-dimensional imaging is applied to cause a change in the spin phase for each slice section according to the present invention.

FIG. 9B shows the phase encode pulses ①, ②, ③ and ④ and the manner of phase change thereof.

The phase is changed progressively to lesser degree for the faults 31 to 32 to 33 in that order, to the extent that the phase change occurs in reverse direction at the fault 34.

Generally, the magnitude of frequency is equivalent to the amount of phase change for a predetermined length of time. When a measurement signal is subjected to Fourier transformation along the axon, therefore, the data associated with each of the faults 31 to 34 is produced as a signal of a different frequency.

According to the present invention, the process of sequence repetition is conducted exactly the same way as in the conventional method of three-dimensional imaging.

Further, the measurement data obtained for each fault is processed in the same manner as in the conventional method of three-dimensional imaging, thereby making it possible to prepare an image of each fault on the basis of the three-dimensional Fourier transformation.

Embodiments have been described above with reference to a case of detecting a spin echo generated by use of a 180° high-frequency magnetic field pulse. The present invention is also applicable directly, however, to a method of gradient echo without using a 180° pulse.

What is claimed is:

1. A method of magnetic resonance imaging comprising the steps of:
   (a) synthesizing a plurality of frequency components corresponding to a plurality of slice sections respectively and generating and applying a single high-frequency magnetic field signal to a subject;
   (b) applying an inclined magnetic field for slicing and a phase encode pulse along the direction (z axis) perpendicular to each slice section;
   (c) applying a phase encode pulse and a frequency encode pulse at right angle to each other along the direction parallel to each slice section; and
   (d) subjecting the resulting measurement signal to two-dimensional Fourier transformation and determining a resonance signal corresponding to each of a plurality of slice sections.

2. A method of magnetic resonance imaging according to claim 1, wherein said step of applying a high-frequency magnetic field includes the step of controlling said frequency components in such a manner as to have a predetermined phase relationship with each other at a predetermined timing.

3. A method of magnetic resonance imaging according to claim 2, wherein said control step includes the step of resetting each phase of said frequency components to a predetermined value before generation of said high-frequency magnetic field.

4. A magnetic resonance imaging apparatus comprising:
   (1) means for generating a single high-frequency magnetic field signal by synthesizing a plurality of frequency components;
   (2) means for applying an inclined magnetic field for slicing and a phase encode pulse along the direction (z axis) perpendicular to each of a plurality of slice sections;
   (3) means for applying a phase encode pulse and a frequency encode pulse along the directions at right angles to each other in parallel to each slice section; and
   (4) subjecting the resulting measurement signal to two ,dimensional Fourier transformation and determining a magnetic resonance signal corresponding to each of said slice sections.

5. A magnetic resonance imaging apparatus according to claim 1, wherein said means for generating frequency components at a predetermined timing includes means for generating the frequency components at a predetermined timing.

6. A magnetic resonance imaging apparatus according to claim 2, wherein said means for generating a plurality of frequency components at a predetermined timing includes:
   memory means for storing digital data;
   an address counter for said memory means; and
   means for resetting said address counter.

* * * * *